US010002747B2

(12) United States Patent
Shareef et al.

(10) Patent No.: US 10,002,747 B2
(45) Date of Patent: Jun. 19, 2018

(54) METHODS AND APPARATUS FOR SUPPLYING PROCESS GAS IN A PLASMA PROCESSING SYSTEM

(75) Inventors: Iqbal Shareef, Fremont, CA (US); Evangelos Spyropoulos, San Jose, CA (US); Mark Taskar, San Mateo, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 1806 days.

(21) Appl. No.: 13/431,950

(22) Filed: Mar. 27, 2012

(65) Prior Publication Data

US 2013/0255883 A1 Oct. 3, 2013

(51) Int. Cl.
C23C 16/455 (2006.01)
C23C 16/52 (2006.01)
H01J 37/32 (2006.01)

(52) U.S. Cl.
CPC ........ *H01J 37/3244* (2013.01); *C23C 16/455* (2013.01); *C23C 16/52* (2013.01); *H01J 37/32899* (2013.01)

(58) Field of Classification Search
CPC ............ C23C 16/455; C23C 16/45561; C23C 16/45582; C23C 16/45585; C23C 16/52; H01J 37/3244; H01J 37/3449; H01J 37/32899
See application file for complete search history.

(56) References Cited

U.S. PATENT DOCUMENTS

| 6,143,080 | A | 11/2000 | Bartholomew et al. |
| 7,100,800 | B2 * | 9/2006 | Yakasovic Saavedra et al. .................. 222/3 |
| 2002/0042205 | A1 | 4/2002 | McMillin et al. |
| 2003/0194862 | A1 * | 10/2003 | Mardian et al. .............. 438/680 |
| 2003/0234047 | A1 * | 12/2003 | Shajii et al. ............... 137/487.5 |
| 2007/0042508 | A1 * | 2/2007 | Shajii et al. ...................... 438/5 |
| 2008/0105202 | A9 | 5/2008 | Fairbairn et al. |
| 2008/0195332 | A1 | 8/2008 | Wong et al. |
| 2009/0077804 | A1 | 3/2009 | Bachrach et al. |
| 2010/0089423 | A1 | 4/2010 | Iijima et al. |
| 2012/0227817 | A1 * | 9/2012 | Cruse et al. ...................... 137/1 |

OTHER PUBLICATIONS

PCT Notification of Transmittal of the International Search Report and the Written Opinion of the International Searching Authority, or the Declaration for PCT/US2013/033374 filed Mar. 21, 2013; 14 pages.

* cited by examiner

*Primary Examiner* — Gordon R Baldwin
*Assistant Examiner* — Benjamin Kendall

(57) ABSTRACT

Methods and apparatus for supplying gas in a plasma processing system that employs the single line drop approach wherein a regulator is shared among multiple mass flow controllers. In one or more embodiments, an accumulator is provided and coupled in gaseous communication with a shared manifold to reduce pressure spikes and dips. A filter, which may be replaceable or non-replaceable separate from the accumulator, is integrated with the accumulator in one or more embodiments.

11 Claims, 6 Drawing Sheets

METHODS AND APPARATUS FOR SUPPLYING PROCESS GAS IN A PLASMA PROCESSING SYSTEM

BACKGROUND OF THE INVENTION

Plasma processing has long been employed for processing substrates (e.g., wafers or flat panels) into electronic products (e.g., integrated circuits or display panels). In plasma processing, one or more gases may be energized and transformed into plasma for processing (e.g., depositing, cleaning, or etching) a substrate.

To maximize substrate processing throughput, to save space, and to maximize efficiency, cluster tools have been employed to process a plurality of substrates in parallel. In a cluster tool approach, multiple plasma processing chambers may be coupled together into a cluster plasma processing system. These chambers may share certain common resources such as certain data processing capabilities, loading robot arms, wafer storage cassettes, exhaust ducting, etc. The plurality of substrates may be processed using the same recipe or using different recipes at the same time in a cluster tool.

Since each chamber may require, depending on the recipe employed, a combination of gases, multiple gas feeds are typically provided to each chamber. Each of the gas feeds may supply a specific gas (such as N2, O2, CHF3, C4F8, etc.). A mass flow controller (MFC) associated with each gas feed at each chamber meters the amount of gas flow required (e.g., a given cubic foot per minute of N2) for a required amount of time to satisfy the recipe requirement. Since a separate MFC is required for each gas feed, a chamber may have multiple MFCs to handle the different types of gas that may be called for by the recipe.

In the past, each chamber receives and regulates its own gas feed supply in order to keep the MFC performance within specification. Regulating the gas fed such that the input pressure to the MFC remains relatively stable is important for accurate MFC performance, even for MFC that are advertised to be pressure insensitive. Due to cost and spatial constraints, the trend has been to share a regulator among multiple MFCs if these MFCs all supply the same type of gas (such as N2). This approach, known by some as the "single line drop" approach, involves using a shared manifold (essentially a branching network of conduits) to supply a given gas (such as N2) from one regulator to multiple MFCs. FIG. 1 shows such a single line drop approach wherein regulator 102 is employed to regulate the input pressure for MFC 104, MFC 106, and MFC 108, the input ports of all of which are connected to shared regulator 102 via shared manifold 110. Although not shown in FIG. 1, the outputs of the MFCs are coupled to supply a gas to different processing chambers.

One advantage of the single-line-drop approach is lower acquisition and maintenance costs and reduced complexity since only one regulator needs to be purchased, calibrated, certified, maintained, serviced, and/or monitored for a plurality of MFCs. Another advantage of the single-line-drop approach is spatial efficiency, since space utilization in the vicinity of each chamber is often at a premium. By reducing the number of regulators (and oftentimes, the associated gauges and other associated components and tubings) in the vicinity of the chamber, more room can be spared for other required components (such as control electronics, heaters, various electro-mechanical components, etc.) which may be needed proximal to the chamber. This is particularly true if the regulator can be positioned remotely from the MFCs such that the regulator does not need to be positioned near the chamber(s).

However, it has been found that when multiple MFCs share a single regulator, processing performance suffers in many cases. For example, it has been found that etch profile and/or uniformity and/or yield has been affected in some cases. Embodiments of the invention seek to improve the processing performance for cluster tools using the single-line-drop approach.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
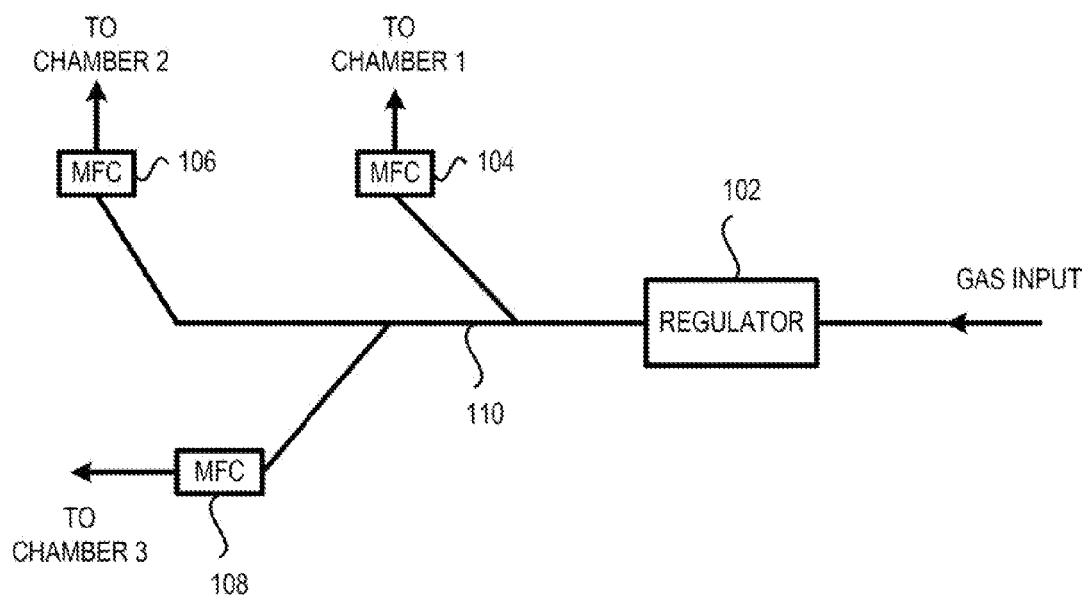
FIG. 1 shows a prior all a single line drop approach wherein a regulator is employed to regulate the input pressure for multiple mass flow controllers.

The present invention will now be described in detail with reference to a few embodiments thereof as illustrated in the accompanying drawings. In the following description, numerous specific details are set forth in order to provide a through understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/ computing device and dedicated/programmable circuits adapted for the various.

Embodiments of the invention relate to methods and apparatus for improving the processing performance for cluster tools using the single-line-drop approach. Recalling that the single-line-drop approach involves multiple MFCs sharing a regulator via a shared manifold, embodiments of the invention seek to minimize MFC cross-talk when multiple MFCs are coupled to the same shared manifold to share the same regulator. As the term is employed herein, MFC cross-talk refers to the fluctuation in manifold pressure experienced by other MFCs when one MFC on the same shared manifold changes one or more of its output parameters (such as turning on, turning off, increasing and/or reducing its output flow to its associated chamber).

In one or more embodiments, there are disclosed techniques and apparatuses for implementing MFC cross-talk reduction in processing chambers. In one or more embodiments, there are disclosed techniques and apparatuses for retrofitting existing processing chambers such that minimal changes are required to reduce the aforementioned MFC cross-talk.

In one or more embodiments, MFC cross-talk reduction involves incorporating a shared accumulator chamber in between the MFCs and the shared regulator. In one or more embodiments, MFC cross-talk reduction involves incorporating a shared accumulator chamber in between the shared manifold and the shared regulator. In one or more embodiments, MFC cross-talk reduction involves incorporating a shared accumulator chamber in between at least a portion of the shared manifold and the shared regulator. The shared accumulator is coupled to the shared manifold in order to absorb the spikes or dips in pressure experienced by the shared manifold when one or more MFCs coupled to the shared regulator change one of its output parameters. For example, the shared accumulator may represent a gas reservoir to absorb or soften the sudden pressure spike (e.g., a sudden increase in pressure) in the shared manifold due to one or more MFCs reducing or shutting off the output. As another example, the shared accumulator may represent a gas reservoir to reduce or soften the sudden pressure drop within the shared manifold when one or more of MFCs open up or increase the output gas flow.

It is realized by the inventors herein that the precision of an MFC, even one advertised tube "pressure insensitive," still tends to be adversely affected by fluctuations in the input pressure such that spikes or dips in the input pressure at the input end of an MFC may vary the output pressure and/or flow rate. In one or more embodiments, the MFC cross-talk reduction involves implementing a shared accumulator between the shared regulator and its MFCs to increase the combined shared manifold/shared accumulator volume to at least 3 times the shared manifold volume that exists without the shared accumulator (i.e., the shared manifold volume that hypothetically results if the shared accumulator is removed and the cluster tool components are moved together such that the shared manifold ends that couple to the now-removed accumulator are rewelded together as if no accumulators existed for the shared manifold).

In one or more embodiments, the MFC cross-talk reduction involves implementing a shared accumulator between the shared regulator and its MFCs to increase the combined shared manifold/shared accumulator volume to about 3-50 times the shared manifold volume that exists without the shared accumulator. In one or more embodiments, the MFC cross-talk reduction involves implementing a shared accumulator between the shared regulator and its MFCs to increase the combined shared manifold/shared accumulator volume to about 5-20 times the shared manifold volume that exists without the shared accumulator. In one or more embodiments, the MFC cross-talk reduction involves implementing a shared accumulator between the shared regulator and its MFCs to increase the combined shared manifold/ shared accumulator volume to about 7-15 times the shared manifold volume that exists without the shared accumulator. In one or more embodiments, the MFC cross-talk reduction involves implementing a shared accumulator between the shared regulator and its MFCs to increase the combined shared manifold/shared accumulator volume about 8-12 times the shared manifold volume that exists without the shared accumulator.

In one or more embodiments, the shared accumulator is integrated with the shared filter such that minimal additional manifold-axis length (the length measured along the shared accumulator tubing axis) is required to implement the shared accumulator. In one or more embodiments, the shared accumulator is integrated with the shared filter such that the shared accumulator can be implemented in the same manifold-axis length previously employed to accommodate the shared filter. In one or more embodiments, the shared accumulator is integrated with the shared filter such that the shared accumulator can be implemented in the same enclosure previously employed to accommodate the shared filter such that little or none enclosure change needs to be made. When the shared filter is integrated with the shared accumulator, the shared filter is disposed, partly or wholly, within the manifold-axis length of the shared accumulator. In other embodiments in which the shared accumulator and the shared filter are not integrated, the shared accumulator and the shared filter may occupy two different positions along the manifold-axis dimension of the shared manifold if desired.

Figure 2:
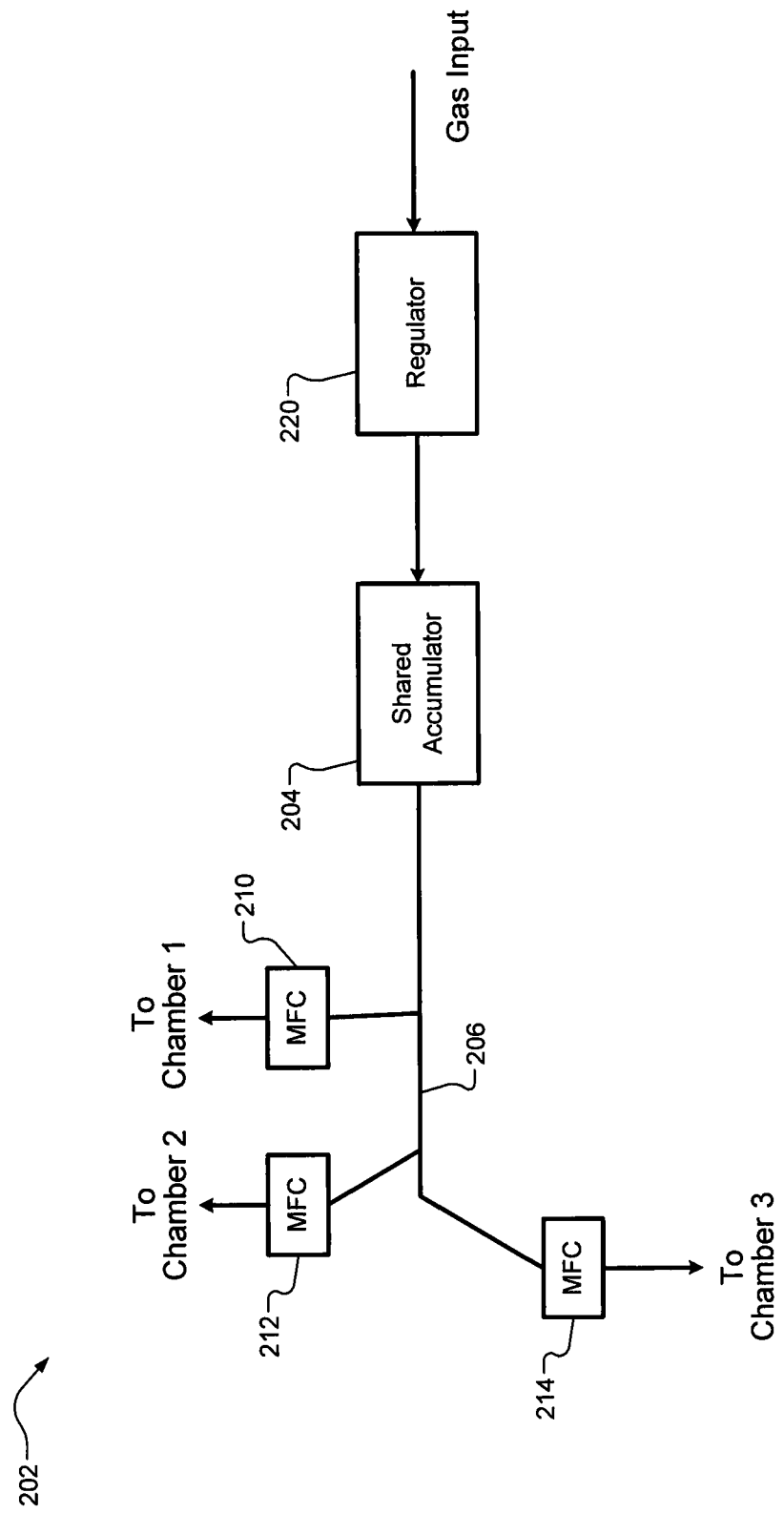
FIG. 2 shows, in accordance with an embodiment of the invention, an arrangement wherein a shared accumulator is provided and in gaseous communication with a shared manifold, to increase the without-shared accumulator volume of shared manifold in order to reduce pressure spikes and dips.

The features and advantages of embodiments of the present invention may be better understood with reference to the figures and discussions that follow. FIG. 2 shows, in accordance with an embodiment of the invention, an arrangement 202 wherein a shared accumulator 204 is provided and in gaseous communication with shared manifold 206 to increase the without-shared accumulator volume of shared manifold 206. Preferably, shared accumulator 204 is shared in one or more embodiments among multiple MFCs 210, 212, and 214. Although only 3 MFCs are shown in the example of FIG. 2, it should be understood that the plurality of MFCs sharing a single shared accumulator may be shared with any number of MFCs that is greater than 2.

Further, it is preferable in one or more embodiments that the shared accumulator be disposed between shared regulator 220 and each of the MFCs such that pressure spikes or dips in shared manifold 206 is at least partially absorbed by shared accumulator 204 without being impeded by shared regulator 220. Further, it is preferable in one or more embodiments that shared accumulator 204 be disposed in the same enclosure that is employed to house shared regulator 220 such that shared accumulator 204 is positioned away from the MFCs and their associated chambers. In this manner, shared accumulator 204 does not occupy much needed space next to each chamber. Although the shared accumulator is shown implemented in an in-line manner in FIG. 2, the shared accumulator may also be coupled to the shared manifold using a T-coupling, for example.

Figure 3:
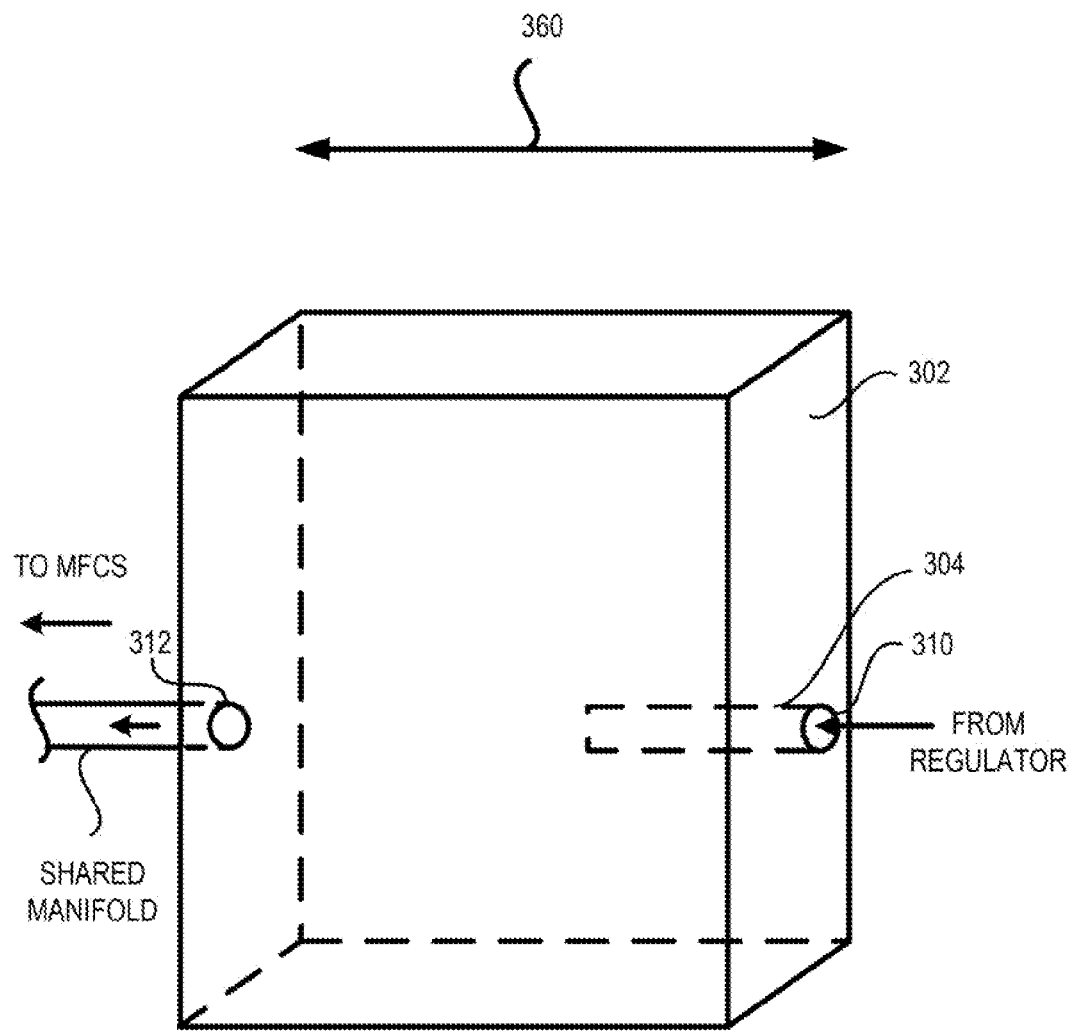
FIG. 3 shows, in accordance with one or more embodiments of the invention, an implementation wherein a shared accumulator is integrated with a shared filter.

FIG. 3 shows, in accordance with one or more embodiments of the invention, an implementation wherein shared accumulator 302 is integrated with, shared filter 304. Shared filter 304 may represent, for example, a nickel or stainless steel (or other materials depending on the gas involved) filter of the type employed to filter gas supplied to the chambers. Accumulator 302 includes an input port 310 (disposed toward the regulator) and an output port 312 (disposed toward the shared manifold). Filters and their use are well-known for plasma gas supplies and are not further discussed here. In the integrated implementation of FIG. 3, the shared filter at least partially (or wholly) shares its manifold-axis length (its length along the direction of arrow 360) with the manifold-axis length of shared accumulator 302.

In its simplest implementation, the shared accumulator represents an enclosed gas volume with an input end and an output end. For example, the shared accumulator may include an enclosure defining a gas-tight volume and have an input port and an output port. In one or more embodiments, the shared accumulator represents a component having a larger cross-section dimension than the cross-section dimension of the shared manifold to which it is attached. The increased cross-section of the shared accumulator serves to provide additional volume to absorb the sudden pressure spikes or dips. The accumulator input end is coupled toward the shared regulator. The output end is coupled toward the MFCs. The shared accumulator is thus disposed between the shared regulator and the MFCs. It is not required that the coupling of the shared accumulator input and the shared regulator be direct (although such may be implemented). In one or more embodiments, a gauge is often inserted between the shared regulator and the shared accumulator, for example. Alternatively or additionally, a filter may be inserted between (or integrated with) the shared accumulator, for example. Likewise, it is not required that the coupling of the shared accumulator output and a given MFC be a direct coupling with only the shared manifold disposed in between (i.e., other components may be inserted in between the accumulator output and an MFC if such insertion does not unduly interfere with the MFC cross-talk reduction functionality of the accumulator).

Figure 4:
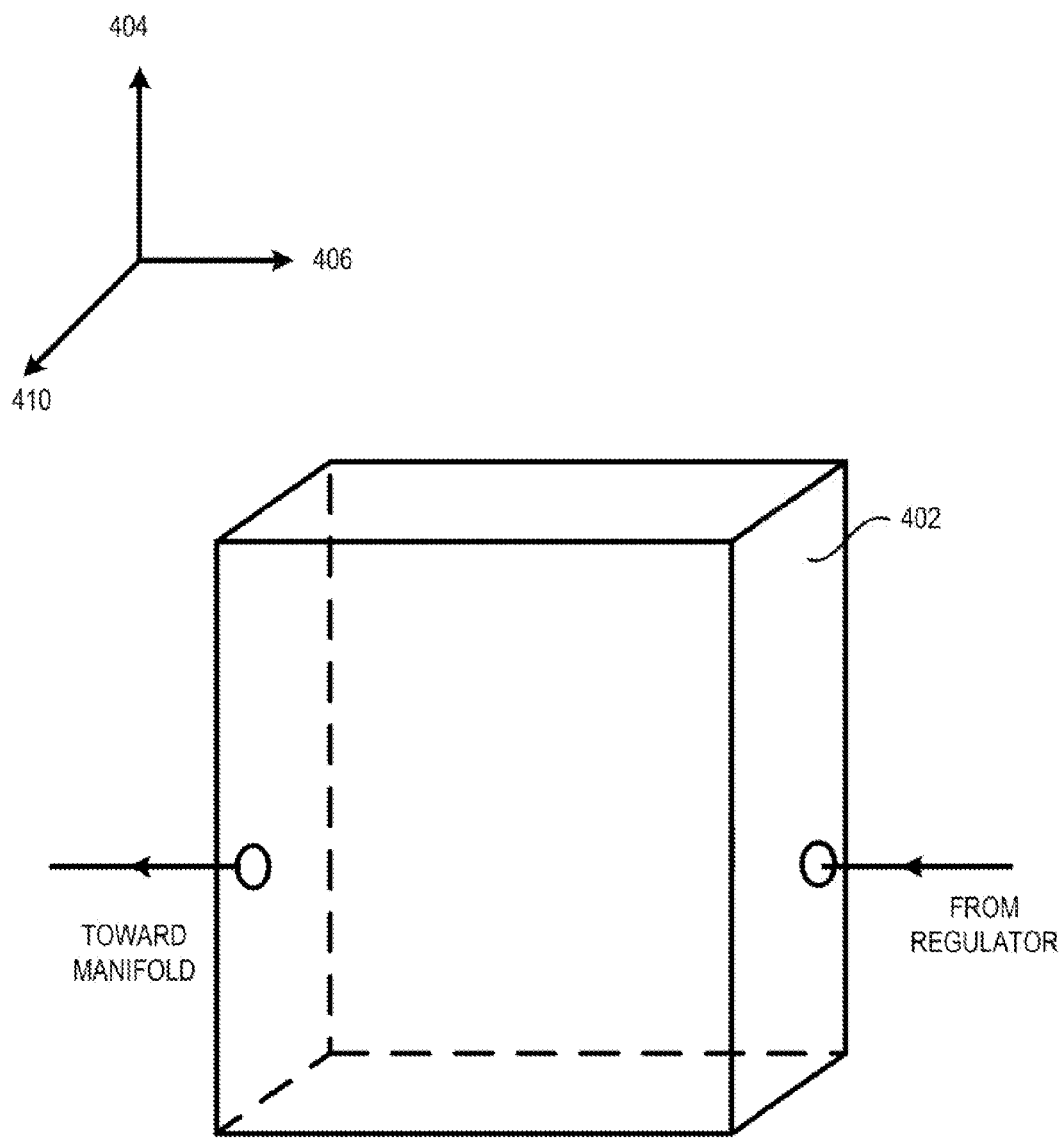
FIG. 4 shows a preferred implementation wherein shared accumulator is implemented with the bulk of its volume disposed in a direction orthogonal to the shared manifold.

FIG. 4 shows a preferred implementation wherein shared accumulator 402 is implemented with the bulk of its volume disposed in a direction orthogonal to the shared manifold axis. In this implementation, the greatest dimension of shared accumulator 402 is in the direction of arrow 404, which is orthogonal to the shared manifold axis (which is oriented along the direction of arrow 406). The smallest dimension of shared accumulator 402 is parallel to the other orthogonal axis (arrow 410) of shared accumulator 402. In another embodiment, the smallest dimension of shared accumulator 402 is parallel to the shared manifold axis. Preferably, the dimension of shared accumulator 402 in the direction of 410 is sized to accommodate the integrated filter (discussed later herein) or the coupling that couples shared accumulator 402 to the shared manifold. It should be understood that this approach seeks to minimize the footprint (in the direction of arrow 406 or 410) by expanding the volume in the positive and/or negative direction of arrow 404. This is a particularly advantageous implementation in that the shared accumulator can be implemented in accordance with the small footprint requirement of most enclosures, rendering it possible to fit a filter-integrated accumulator into the footprint formerly occupied by the filter and simplifying the retrofitting task.

Although the example of FIG. 4 shows the shared accumulator to be substantially rectangular and/or cubic in shape, the shared accumulator may have any shape, including cylindrical, spherical, etc. Further, the shared accumulator may have, in one or more embodiments, an irregular shape to accommodate an irregular space. Further, the shared accumulator may be implemented, in one or more embodiments, by a larger diameter tube in one section of the shared manifold. In one or more embodiments, the shared accumulator is not implemented by increasing the cross-sectional dimension of the entire shared manifold length (or more than 50% of the shared manifold length) between shared regulator and its MFCs since such an approach would involve a disadvantageous use of the restricted space near the MFCs or near the chambers.

Figure 5:
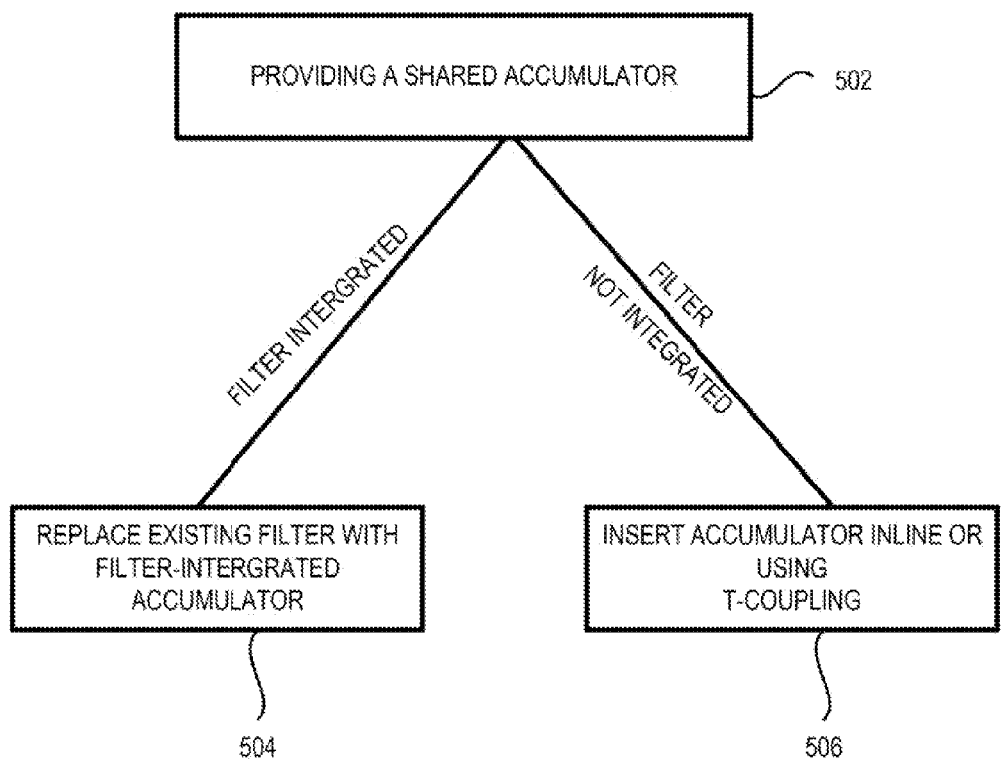
FIG. 5 shows, in accordance with one or more embodiments of the invention, a method for retrofitting an existing cluster tool with the MFC cross-talk reduction capability.

FIG. 5 shows, in accordance with one or more embodiments of the invention, a method for retrofitting an existing cluster tool with the MFC cross-talk reduction capability. In step 502, a shared accumulator having a volume to increase the shared manifold volume to at least 3 times the manifold volume without the shared accumulator is provided. If the shared accumulator is integrated with a filter, the filter-integrated shared accumulator is employed to replace the existing shared filter in step 504. In step 504, the shared accumulator is disposed between the shared regulators and the MFCs. If spacer tubings are required or different couplings are required, the spacer tubings or different couplings are fitted to ensure that the shared accumulator and the existing shared manifold are gas-tight.

If the shared accumulator is not integrated with a filter, the shared accumulator is inserted (in step 506) in-line with the shared manifold or by using a T-coupling between the shared regulators and the MFCs. If spacer tubings are required or different couplings are required, the spacer tubings or different couplings are fitted to ensure that the shared accumulator and the existing shared manifold are gas-tight.

In accordance with one or more embodiments of the invention, a non-replaceable integrated filter approach is employed wherein the filter is intended to be integrated in a non-removable manner with the shared accumulator. This approach simplifies retrofitting and replacement in that the shared accumulator may simply substitute in for the existing filter and provides an integrated shared accumulator/filter function. Such a non-removable approach may take the form of the embodiment of FIG. 3, for example.

Figure 6:
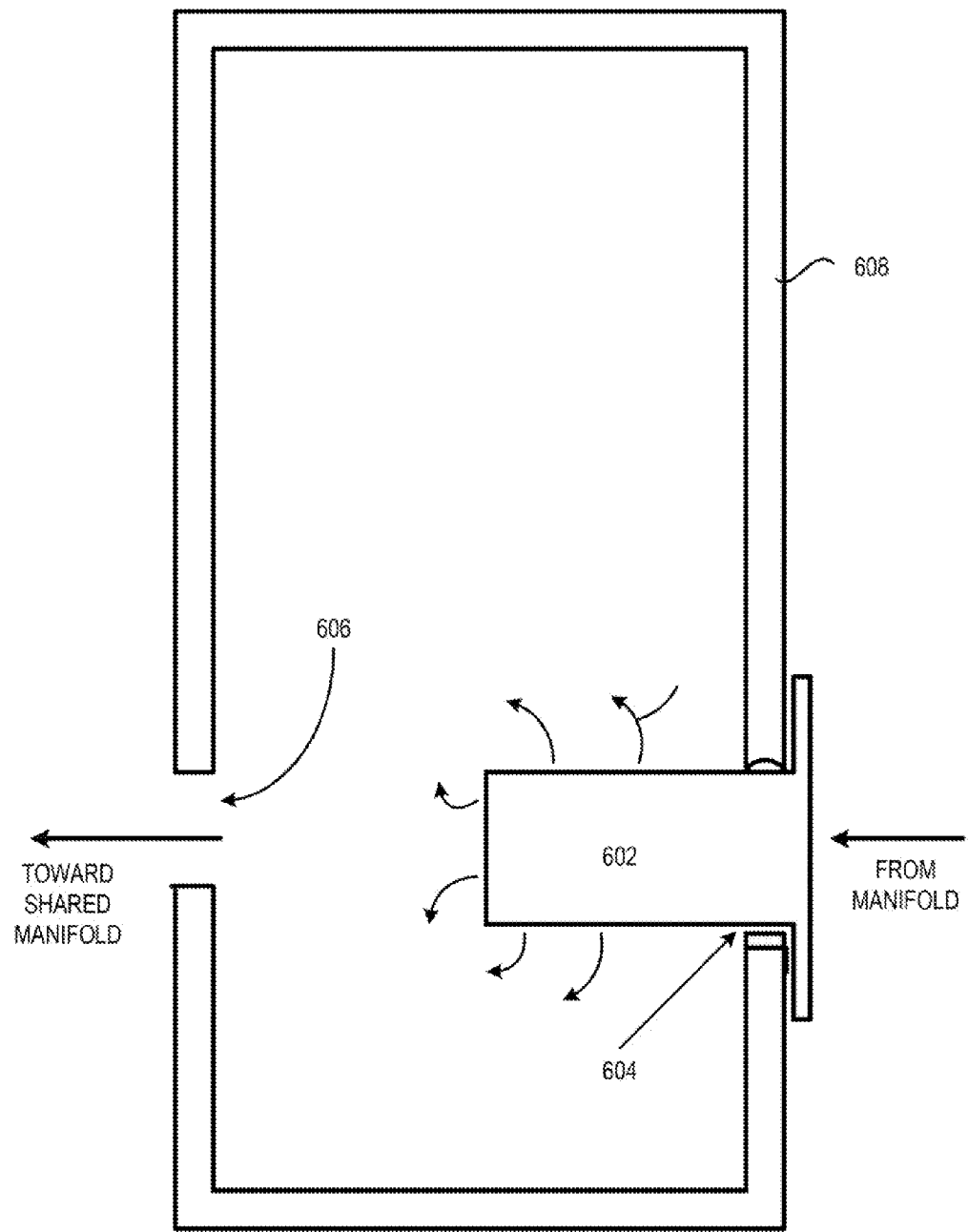
FIG. 6 shows, in accordance with one or more embodiments of the invention, a simplified drawing of the replaceable filter approach wherein the accumulator is provided with a replaceable filter.

FIG. 6 shows, in accordance with one dr more embodiments of the invention, a simplified drawing of the replaceable filter approach wherein accumulator 608 is provided with a replaceable filter 602. In the implementation of FIG. 6, filter 602 may be inserted into an aperture 604 in the shared accumulator and held capture therein by, for example, a coupling (not shown). The coupling may be used, for example, to couple the accumulator input to a tube section (the tube section may be coupled to the gauge or the regulator for example) and the filter may be held captive by the coupling against the accumulator body. The coupling may be also used, for example, to couple the accumulator input to the gauge or the regulator and the filter may be held captive by the coupling against the accumulator body. For maximum MFC cross-talk reduction performance, it is preferable that the filter be implemented at the input end (toward the regulator) of the accumulator and not at the output end 606 (toward the shared manifold) of the accumulator such that filtered gas is released into the interior volume of the accumulator prior to exiting via the accumulator output port. In this manner, the interior volume of the accumulator is in unimpeded gaseous communication with the shared manifold. The coupling (not shown in FIG. 6) may attach to the shared accumulator using any conventional attachment technique, including threading, pressure fitting, pressure banding, etc.

In one or more embodiments, the shared accumulator is disposed in the same housing that is employed to house the facility interface box (FIB) that houses the primary air-operated, normally closed valves for the gas supply feeds (e.g., N2, O2, CHF3, etc.) from the gas supply tanks. In the single-line-drop implementation that also employs such FIB, the primary air-operated, normally closed valve for each gas supply feed represents the primary valve for turning on or off each gas to the cluster tool. The FIB in this implementation is remoted from the MFCs (which are typically disposed closer to the chambers). Multiple gas feeds, each with its own primary air-operated, normally closed valve may be implemented in each FIB enclosure. Each shared accumulator in such FIB enclosure is coupled to its remote MFCs via a shared manifold. In this implementation, retrofitting is vastly simplified since only the FIB enclosure needs to be opened up and retrofitted with shared accumulators to provide the MFC cross-talk reduction for the remotely-disposed MFCs/chambers. If the shared accumulator is constructed in such a manner that it can be integrated with the filter (as discussed above), retrofitting may be as simple as drop-in replacement that replaces the filter with a filter-integrated shared accumulator for each gas feed. This is particularly advantageous for owners of existing cluster tools who wish to reduce MFC cross-talk in single-line-drop cluster tools since such a retrofitting technique using the inventive shared accumulator approach is simple, quick, and relatively inexpensive.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A plasma processing system for supplying a processing gas to a plurality of plasma chambers, the plasma processing system comprising:
    a regulator configured to receive the processing gas;
    an accumulator connected to the regulator, wherein
    the regulator is configured to regulate supply of the processing gas to the accumulator to maintain a stable pressure of the processing gas supplied to the accumulator;
    a shared manifold connected to the accumulator, wherein the accumulator is configured to (i) while supplying a first portion of the processing gas to the shared manifold, receive a second portion of the processing gas from the regulator and accumulate the processing gas, and (ii) absorb at least portions of spikes and dips in pressures within the shared manifold; and
    a plurality of mass flow controllers connected to the shared manifold, wherein the accumulator is connected between the regulator and the plurality of mass flow controllers, and wherein the plurality of mass flow controllers control flow of portions of the processing gas out of branches of the shared manifold to the plurality of plasma chambers.

2. The plasma processing system of claim 1, wherein:
    the accumulator comprises a gas containment structure having a cross-sectional area that is larger than cross-sectional area of a portion of the manifold; and
    the accumulator is connected to the portion of the manifold.

3. The plasma processing system of claim 1, further comprising a filter, wherein the filter is integrated within the accumulator and filters the processing gas prior to be supplied from the accumulator to the shared manifold, the plurality of mass flow controllers and the plurality of plasma chambers.

4. The plasma processing system of claim 3, wherein the filter is integrated in an input end of the accumulator.

5. The plasma processing system of claim 4, wherein the accumulator and filter are configured to allow the filter to be inserted into the accumulator and held via a coupling, such that the filter is replaceable.

6. The plasma processing system of claim 1, wherein the accumulator is implemented in-line with the shared manifold.

7. The plasma processing system of claim 5, wherein:
    the accumulator is coupled to the shared manifold via the coupling, and
    the coupling is a 'T'-shaped coupling.

8. The plasma processing system of claim 1, wherein the accumulator is disposed remotely from the plurality of mass flow controllers such that the accumulator is not disposed at any of the multiple processing chambers.

9. The plasma processing system of claim 1, wherein a combined volume of the accumulator and the shared manifold is at least 3 times a volume of the shared manifold without the accumulator.

10. The plasma processing system of claim 1, wherein:
    the regulator is directly coupled to the accumulator; and
    the accumulator is directly coupled to the shared manifold.

11. The plasma processing system of claim 4, further comprising a 'T'-shaped coupling, wherein:
    the filter is implemented in the 'T'-shaped coupling;
    the accumulator receives the processing gas via the 'T'-shaped coupling;
    the 'T'-shaped coupling comprises a first portion and a second portion;
    the first portion of the 'T'-shaped coupling is disposed on an exterior of the accumulator; and
    the second portion of the 'T'-shaped coupling is disposed within the accumulator.

* * * * *